(12) United States Patent
Wang

(10) Patent No.: US 12,224,244 B2
(45) Date of Patent: Feb. 11, 2025

(54) PACKAGE SUBSTRATE AND SEMICONDUCTOR STRUCTURE WITH SAME

(71) Applicant: CHANGXIN MEMORY TECHNOLOGIES, INC., Hefei (CN)

(72) Inventor: Hailin Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 479 days.

(21) Appl. No.: 17/582,171

(22) Filed: Jan. 24, 2022

(65) Prior Publication Data

US 2022/0254720 A1    Aug. 11, 2022

Related U.S. Application Data

(63) Continuation of application No. PCT/CN2021/109320, filed on Jul. 29, 2021.

(30) Foreign Application Priority Data

Feb. 5, 2021  (CN) .......................... 202110164409.7

(51) Int. Cl.
  *H01L 23/538* (2006.01)
  *H01L 23/34* (2006.01)
(52) U.S. Cl.
  CPC .......... *H01L 23/5381* (2013.01); *H01L 23/34* (2013.01); *H01L 23/5384* (2013.01); *H01L 23/5386* (2013.01)
(58) Field of Classification Search
  CPC . H01L 23/5381; H01L 23/34; H01L 23/5384; H01L 23/5386; H01L 23/49838; H01L 23/49816

USPC ......................................................... 257/522
See application file for complete search history.

(56) References Cited

U.S. PATENT DOCUMENTS

| 6,106,259 A * | 8/2000 | Lee .......................... B29C 45/02 |
| | | 264/272.17 |
| 6,268,650 B1 * | 7/2001 | Kinsman ............. H01L 23/3107 |
| | | 257/691 |
| 6,338,985 B1 * | 1/2002 | Greenwood .......... H01L 21/565 |
| | | 438/126 |

(Continued)

FOREIGN PATENT DOCUMENTS

| CN | 101030565 A | 9/2007 |
| CN | 101347057 A | 1/2009 |

(Continued)

OTHER PUBLICATIONS

Notice of Allowance of the Chinese application No. 202110164416. 7, issued on Feb. 16, 2022, 5 pgs.

(Continued)

*Primary Examiner* — Vu A Vu
(74) *Attorney, Agent, or Firm* — Kilpatrick Townsend & Stockton LLP

(57) ABSTRACT

There is provided a package substrate and a semiconductor structure with the same. The package substrate includes a body and a plurality of conducive bridges. The body includes an opening region. The plurality of conductive bridges are disposed separately in the opening region, and adjacent conductive bridges have a respective distance value. At least two of the distance values are not equal.

19 Claims, 7 Drawing Sheets

(56) References Cited

U.S. PATENT DOCUMENTS

| | | | |
|---|---|---|---|
| 6,441,503 B1 * | 8/2002 | Webster | G01L 19/147 |
| | | | 257/E21.504 |
| 6,870,247 B2 * | 3/2005 | Fee | H01L 23/13 |
| | | | 257/730 |
| 7,332,818 B2 | 2/2008 | Memis | |
| 7,622,384 B2 | 11/2009 | Memis | |
| 8,338,236 B1 * | 12/2012 | Low | H01L 21/565 |
| | | | 257/E21.504 |
| 8,441,121 B2 | 5/2013 | Sun | |
| 9,210,813 B2 * | 12/2015 | Xie | H05K 3/00 |
| 9,439,296 B2 | 9/2016 | Akashi | |
| 9,935,144 B1 * | 4/2018 | Lin | H01L 27/14618 |
| 10,308,502 B2 * | 6/2019 | Otte | G01L 9/0054 |
| 10,605,684 B2 * | 3/2020 | Gritti | G01L 9/0045 |
| 11,373,936 B2 * | 6/2022 | Reiss | H01L 24/49 |
| 2002/0005576 A1 | 1/2002 | Sakamoto | |
| 2002/0121688 A1 | 9/2002 | Kinsman | |
| 2006/0255460 A1 | 11/2006 | Memis | |
| 2008/0102562 A1 | 5/2008 | Memis | |
| 2009/0025970 A1 | 1/2009 | Yanagisawa | |
| 2011/0062577 A1 | 3/2011 | Hung | |
| 2012/0199955 A1 | 8/2012 | Sun | |
| 2014/0321091 A1 | 10/2014 | Zhang et al. | |
| 2015/0062845 A1 | 3/2015 | Akashi | |
| 2016/0307873 A1 | 10/2016 | Chen et al. | |
| 2019/0227646 A1 | 7/2019 | Ye | |

FOREIGN PATENT DOCUMENTS

| | | |
|---|---|---|
| CN | 101587880 A | 11/2009 |
| CN | 102629560 A | 8/2012 |
| CN | 104604346 A | 5/2015 |
| CN | 104684251 A | 6/2015 |
| CN | 106057748 A | 10/2016 |
| CN | 107644847 A | 1/2018 |
| CN | 108052239 A | 5/2018 |
| CN | 106298731 B | 7/2020 |
| CN | 112992849 A | 6/2021 |
| JP | S58115842 A | 7/1983 |

OTHER PUBLICATIONS

Intellectual Property Office of Singapore, office action issued in application No. 11202253116X on Sep. 30, 2024.

United States Patent and Trademark Office, Non-Final office action issued in U.S. Appl. No. 17/580,760, filed Aug. 15, 2024.

* cited by examiner

PACKAGE SUBSTRATE AND SEMICONDUCTOR STRUCTURE WITH SAME

CROSS-REFERENCE TO RELATED APPLICATIONS

This is a continuation application of International Patent Application No. PCT/CN2021/109320, filed on Jul. 29, 2021, which claims priority to Chinese Patent Application No. 202110164409.7, filed on Feb. 5, 2021 and entitled "PACKAGE SUBSTRATE AND SEMICONDUCTOR STRUCTURE WITH SAME". The disclosures of International Patent Application No. PCT/CN2021/109320 and Chinese patent application No. 202110164409.7 are hereby incorporated by reference in their entireties.

BACKGROUND

A substrate is commonly used in a chip packaging and manufacturing process. Upon packaging the substrate, gas may not be exhausted timely in the packaging process due to the structural limitations of the substrate, which may easily lead to internal hollows.

SUMMARY

The present disclosure relates to the technical field of semiconductors, and in particular to a package substrate and a semiconductor structure with the same.

The present disclosure provides a package substrate and a semiconductor structure with the same, to improve performance of the package substrate.

According to a first aspect of the present disclosure, there is provided a package substrate, which includes a body and a plurality of conductive bridges.

The body includes an opening region.

The plurality of conductive bridges are disposed separately in the opening region, and adjacent conductive bridges among the plurality of conductive bridges have a respective distance value.

At least two distance values are not equal.

According to a second aspect of the present disclosure, there is provided a package substrate, which includes a body and a plurality of conductive bridges.

The body includes an opening region.

The plurality of conductive bridges include a first conductive bridge, a second conductive bridge and a third conductive bridge. The first conductive bridge, the second conductive bridge and the third conductive bridge are disposed in sequence in the opening region.

A distance value between the first conductive bridge and the second conductive bridge is not equal to a distance value between the second conductive bridge and the third conductive bridge.

According to a third aspect of the present disclosure, there is provide a package substrate, which includes a body and a plurality of conductive bridges.

The body includes an opening region, the opening region includes a first side wall and a second side wall opposite to each other, and a packaging glue enters the opening region from the first side wall and flows to the second side wall.

The plurality of conductive bridges are disposed separately in the opening region.

Conductive bridges, among the plurality of conductive bridges, close to the first side wall are arranged more densely than conductive bridges, among the plurality of conductive bridges, close to the second side wall.

According to a fourth aspect of the present disclosure, there is provided a semiconductor structure, which includes the above-described package substrate and a chip.

BRIEF DESCRIPTION OF THE DRAWINGS

Various objects, features and advantages of the present disclosure will become more apparent by considering the following detailed description of the preferred implementations of the present disclosure in conjunction with the drawings. The drawings are merely exemplary illustrations of the present disclosure, and are not necessarily drawn to scale. In the drawings, the same reference numerals refer to the same or similar components throughout.

Figure 1:
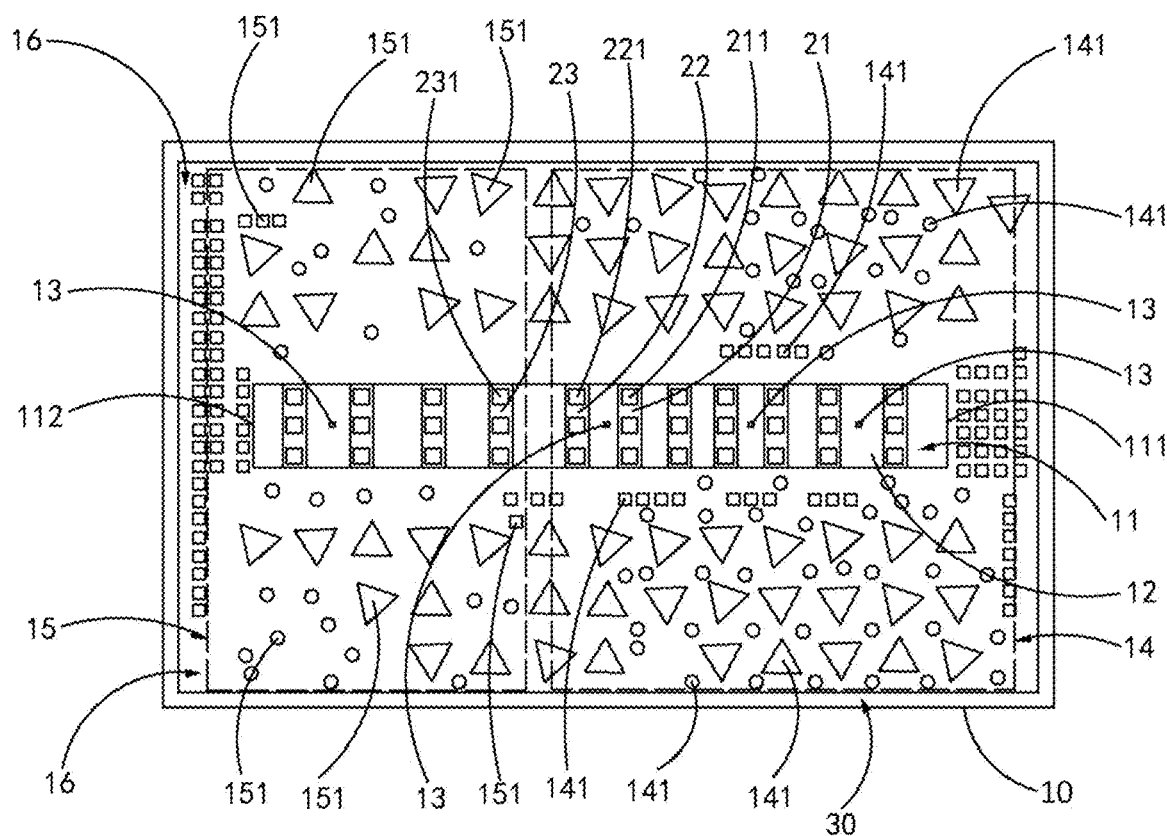
FIG. 1 is a schematic structure diagram of a package substrate according to an exemplary implementation.

Reference numerals in the drawings are described as follows.

10, body. 11, opening region. 111, first side wall. 112, second side wall. 12, gap. 13, vent hole. 14, first region. 141, first cutout through hole. 15, second region. 151, second cutout through hole. 16, solder ball region. 21, first conductive bridge. 211, first through hole. 212, first bridging section. 213, second bridging section. 214, third bridging section. 22, second conductive bridge. 221, second through hole. 23, third conductive bridge. 231, third through hole. 30, conductive layer.

DETAILED DESCRIPTION

Typical embodiments embodying the features and advantages of the present disclosure will be described in detail in the following description. It is to be understood that the present disclosure may have various changes in different embodiments, which do not depart from the scope of the present disclosure, and the descriptions and drawings therein are essentially for illustrative purposes, rather than limiting the present disclosure.

The following descriptions of different exemplary implementations of the present disclosure are described with reference to the drawings, which form a part of the present disclosure. Different exemplary structures, systems and operations that may implement various aspects of the present disclosure are shown therein by way of example. It is to be understood that other specific solutions of components, structures, exemplary devices, systems and steps may be used, and structural and functional modifications may be made without departing from the scope of the present disclosure. Moreover, although the terms like "on", "between", "within" may be used in this specification to describe different exemplary features and elements of the present disclosure, these terms are used herein for convenience only, for example, according to the exemplary directions in the drawings. Nothing in this specification is to be construed as requiring a specific three-dimensional direction of a structure to fall within the scope of the present disclosure.

An embodiment of the present disclosure provides a package substrate. Referring to FIG. 1, the package substrate includes a body 10 and a plurality of conductive bridges. The body 10 includes an opening region 11. The plurality of conductive bridges disposed separately in the opening region 11. Any adjacent conductive bridges have a respective distance value. At least two distance values are not equal.

In the package substrate according to an embodiment of the present disclosure, the opening region 11 is formed on the body 10, and the plurality of conductive bridges are disposed separately in the opening region 11, so that signal transmission quality of the conductive bridges can be enhanced. Moreover, distance values between the plurality of conductive bridges are not all equal, that is, some conductive bridges distributed in the opening region 11 are relatively dense. Therefore, packaging resin can be blocked during packaging the package substrate, such that a flow rate of the packaging resin can be reduced and gas in the opening region 11 can be exhausted in time. Therefore, the problem of internal hollows can be avoided, and the performance of the package substrate can be improved.

Adjacent conductive bridges among the plurality of conductive bridges have a respective distance value, and there are different distance values between the plurality of conductive bridges. The distance value is a distance between the adjacent conductive bridges.

It is to be noted that when the package substrate is packaged through packaging resin, a position close to the conductive bridges having a small distance values may be used as an inflow position of the packaging resin. Considering that an inflow rate of the packaging resin may be relatively high, conductive bridges with large density may be provided to reduce a flow rate of the packaging resin, thereby enabling the gas to be reliably exhausted, and avoiding formation of the hollows. In the following, the flow rate of the packaging resin will gradually be small, so that the conductive bridges with large density may be provided.

It is to be noted that, for a distance value between adjacent conductive bridges, when outer edges of the plurality of conductive bridges are all consistent with each other, the distance value between any adjacent conductive bridges may be a distance value between two same location points of the adjacent conductive bridges. Specifically, a straight line parallel to a length direction of the opening region 11 is considered as a baseline, the straight line may form an intersection point with each conductive bridge, and a distance value between adjacent intersection points is the distance value between adjacent conductive bridges. When the outer edge of at least one conductive bridge among the plurality of conductive bridges is not identical to the outer edges of the other conductive bridges, the distance value may be a minimum distance value between adjacent conductive bridges.

In an embodiment, the package substrate includes a body 10 and a plurality of conductive bridges. The body 10 includes an opening region 11. The plurality of conductive bridges include a first conductive bridge 21, a second conductive bridge 22 and a third conductive bridge 23. The first conductive bridge 21, the second conductive bridge 22 and the third conductive bridge 23 are disposed in sequence in the opening region 11. A distance value between the first conductive bridge 21 and the second conductive bridge 22 is not equal to a distance value between the second conductive bridge 22 and the third conductive bridge 23.

The package substrate in this embodiment includes the first conductive bridge 21, the second conductive bridge 22 and the third conductive bridge 23 that are disposed in sequence in the opening region 11. The distance value between the first conductive bridge 21 and the second conductive bridge 22 is not equal to the distance value between the second conductive bridge 22 and the third conductive bridge 23.

In some embodiments, the distance value between the first conductive bridge 21 and the second conductive bridge 22 is less than the distance value between the second conductive bridge 22 and the third conductive bridge 23. In this case, the packaging resin may pass through the first conductive bridge 21 firstly, and then flow to the second conductive bridge 22 and the third conductive bridge 23.

In some embodiments, the distance value between the first conductive bridge 21 and the second conductive bridge 22 is greater than the distance value between the second conductive bridge 22 and the third conductive bridge 23. In this case, the packaging resin may pass through the third conductive bridge 23 firstly, and then flow to the second conductive bridge 22 and the first conductive bridge 21.

In an embodiment, the package substrate includes a body 10 and a plurality of conductive bridges. The body 10 includes an opening region 11. The opening region 11 includes a first side wall 111 and a second side wall 112 opposite to each other. A packaging glue enters the opening region 11 through the first side wall 111, and flows to the second side wall 112. The plurality of conductive bridges are disposed separately in the opening region 11. Among the plurality of conductive bridges, conductive bridges close to the first side wall 111 are arranged more densely than conductive bridges close to the second side wall 112.

The package substrate in this embodiment includes the plurality of conductive bridges disposed separately in the opening region 11. The plurality of conductive bridges are disposed with different densities. The conductive bridges close to the first side wall 111 are arranged densely, and the conductive bridges close to the second side wall 112 are arranged sparsely, that is, the conductive bridges close to an inlet of the packaging glue are dense. Therefore, a flow rate of the packaging glue can be reduced, thereby enabling the gas to be reliably exhausted, and avoiding formation of hollows. The packaging glue may be packaging resin.

It is to be noted that in an initial stage, injection molding speed of the packaging resin is high, and residual air is easily enveloped by the packaging resin to form hollows. Increase on arrangements of the conductive bridges may reduce the flow rate of the resin, thereby enabling the gas to be reliably exhausted, and avoiding formation of hollows. In this case, the conductive bridges at the inlet of the packaging resin are densely arranged.

In an embodiment, as illustrated in FIG. 1, a gap 12 is provided between adjacent conductive bridge among the plurality of conductive bridges, the body 10 is provided with a vent hole 13, and the vent hole 13 is opposite to the gap 12, that is, the conductive bridges avoids the vent hole 13, so that it is ensured that the vent hole 13 can exhaust gas timely.

In an embodiment, there are a plurality of vent holes 13, and the plurality of vent holes 13 are separately disposed on the body 10 and each of the plurality of vent holes corresponds to a respective gap 12. Therefore, it is ensured that the gas can be exhausted timely in the packaging process, and the hollows can be avoided to be formed.

In some embodiments, the plurality of vent holes may be disposed at equal pitches.

In an embodiment, any adjacent vent holes 13 have a respective hole pitch, that is, there are a plurality of hole pitches for the plurality of vent holes. A hole pitch is a distance between adjacent vent holes 13. At least two hole pitches in the plurality of hole pitches are not equal, that is, the plurality of vent holes 13 are also arranged sparsely and densely, to satisfy a demand of gas exhausting.

It is to be noted that the vent holes 13 close to an inlet of the packaging resin may be relatively dense, thus a flow rate of packaging resin is relatively high, and timely gas suction is required. The following vent holes 13 may be relatively sparse.

In an embodiment, the plurality of hole pitches are all different from each other, and the plurality of hole pitches gradually increase along a first length direction of the opening region 11, that is, the vent holes 13 are arranged densely to sparsely along a flow direction of packaging resin. Therefore, it is ensured that the gas can be exhausted timely, and there is no need to provide too many vent holes 13.

It is to be noted that a length direction of the opening region 11 includes the first length direction and a second length direction, and the first length direction and the second length direction are two opposite directions. Therefore, when the plurality of hole pitches gradually increase along the first length direction of the opening region 11, the plurality of hole pitches gradually decrease along the second length direction of the opening region 11.

It is to be noted that, among the plurality of vent holes 13, some of the vent holes 13 that are close to the first side wall 111 are arranged more densely than some of the vent holes 13 that are close to the second side wall 112. Further, the plurality of hole pitches gradually increase in an extension direction from the first side wall 111 to the second side wall 112.

In an embodiment, adjacent conductive bridges between adjacent vent holes 13 with a largest hole pitch have a largest distance value, that is, the vent holes 13 which are arranged sparsely correspond to the conductive bridges which are arranged sparsely, so that packaging resin that flows slower corresponds to a smaller number of conductive bridges and a smaller number of vent holes 13.

In an embodiment, there are at least two conductive bridges between the adjacent vent holes 13. In such way, the number of vent holes 13 would not excess while ensuring the gas to be reliably exhausted, so that a processing procedure can be shortened, and influence on the structure of the package substrate can be avoided.

In an embodiment, there are at least three conductive bridges between adjacent vent holes 13, and distance values between adjacent conductive bridges in the at least three conductive bridges are all equal. In other words, a plurality of conductive bridges between adjacent vent holes 13 are distributed with equal pitches, so that the package substrate between the adjacent vent holes 13 has same local strength, to balance local warping.

In an embodiment, the vent holes 13 include a first vent hole, a second vent hole and a third vent hole. The first vent hole, the second vent hole and the third vent hole are disposed in sequence. There are a plurality of conductive bridges between the first vent hole and the second vent hole, and there are a plurality of conductive bridges between the second vent hole and the third vent hole. A distance value between the adjacent conductive bridges between the first vent hole and the second vent hole is not equal to a distance value between adjacent conductive bridges between the second vent hole and the third vent hole, so that the arrangement of the conductive bridges and the vent holes can ensure the gas to be exhausted timely, thereby avoiding the problem of internal hollows.

Specifically, the conductive bridges close to an inlet of the packaging glue may be relatively dense, and the number of the vent holes 13 may also be relatively large. The conductive bridges far away from the inlet of the packaging glue may be relatively sparse, and the number of the vent holes 13 may also be relatively small. Alternatively, in some embodiments, the number of the vent holes 13 close to the inlet of the packaging glue may be relatively small, but the conductive bridges between the adjacent vent holes 13 may be arranged more densely, thereby reducing a flow rate of the packaging glue, so that the gas can be exhausted timely. In summary, a relatively large number of vent holes 13 may be disposed at a position where the flow rate of the packaging glue is relatively high. When the flow rate of the packaging glue is still high at the positions of the vent holes 13, a density of the conductive bridges may be further increased.

In an embodiment, as illustrated in FIG. 1, the body 10 further includes a solder ball region 16. The solder ball region 16 is located outside the opening region 11. The package substrate further includes a conductive layer 30. The conductive layer 30 is located within the solder ball region 16. The opening region 11 is located in a middle region of the body 10, that is, the opening region 11 is located inside an outer edge of the body 10 and does not intersect with the outer edge of the body 10. The conductive layer 30 is disposed around the opening region 11, and a plurality of cutout through holes are formed on the conductive layer 30, that is, an area of the conductive layer 30 is reduced. The cutout through holes are used for forming signal connection structures (such as conductive bumps) subsequently.

Optionally, as illustrated in FIG. 1, a surface of the body 10 includes a first region 14 and a second region 15. The first region 14 and the second region 15 are distributed in sequence along a length direction of the opening region 11. The first region 14 and the second region 15 both include the conductive bridges and the conductive layer 30. A ratio of a sum of an area of the conductive bridges and an area of the conductive layer 30 in the first region 14 to a sum of an area of the conductive bridges and an area of the conductive layer 30 in the second region 15 is less than 1.1. In other words, an area of conductive material in the first region 14 is substantially equal to that in the second region 15, to balance local strength of the package substrate, so that overall warpage of the package substrate can be improved, and the problem of serious local warpage can be avoided.

Optionally, a ratio of the sum of the area of the conductive bridges and the area of conductive layer 30 in the second region 15 to the sum of the area of the conductive bridges and the area of the conductive layer 30 in the first region 14 is less than 1.1.

In an embodiment, with reference to FIG. 1, the conductive layer 30 in the first region 14 is provided with a plurality of first cutout through holes 141, and the conductive layer 30 in the second region 15 is provided with a plurality of second cutout through holes 151. An area of the conductive layers 30 becomes smaller, and the area of conductive material in the first region 14 is substantially equal to the area of conductive material in the second region 15.

It is to be noted that the first cutout through holes 141 and the second cutout through holes 151 may be structures of any shape. Shapes illustrated in FIG. 1 are not intended for limiting the shapes of the cutout through holes, but only mean that through holes are formed on the conductive layer 30.

In an embodiment, an area of the conductive bridges in the first region 14 is larger than an area of the conductive bridges in the second region 15, and an area of the conductive layer 30 in the first region 14 is smaller than an area of the conductive layer in the second region 15. That is, the conductive bridges in the first region 14 are arranged densely, and the conductive layer 30 in the first region 14 is sparse. Correspondingly, the conductive bridges in the second region 15 are arranged sparsely, and the conductive layer 30 in the second region 15 is dense. Therefore, local strength of the package substrate can be balanced, and overall warpage of the package substrate can be balanced.

Optionally, the area of the conductive bridges in the first region 14 is smaller than the area of the conductive bridges in the second region 15, and the area of the conductive layer 30 in the first region 14 is larger than the area of the conductive layer in the second region 15.

In an embodiment, as illustrated in FIG. 1, the plurality of conductive bridges include a first conductive bridge 21. The first conductive bridge 21 is provided with first through holes 211. Overall area of the conductive bridges can be reduced, thereby reducing warpage of the body 10, and improving operational performance of the package substrate in the structure.

It is to be noted that the body 10 includes a bottom surface and a top surface. The bottom surface and the top surface are disposed oppositely. The top surface may be used for connecting with a chip, and the bottom surface may be connected with external conductive bumps and other components.

In the embodiment, the opening region 11 is located on the bottom surface, and a middle region of the bottom surface is provided with an opening region 11.

Correspondingly, the top surface of the body 10 is provided with a top conductive material layer. An area of the top conductive material layer may be as close as possible to an area of the bottom conductive material layer by reducing the area of the bottom conductive material layer, thereby reducing warpage of the body 10.

In an embodiment, the conductive bridges and the conductive layer 30 may be Cu, Al or W.

In an embodiment, there are a plurality of first through holes 211, and the plurality of first through holes 211 are disposed separately on the first conductive bridge 21, that is, adjacent first through holes 211 are not communicated with each other, so that structural strength of the first conductive bridge 21 can be ensured, and an area of the conductive bridge can be further reduced.

In some embodiments, the plurality of first through holes 211 may be disposed arbitrarily on the first conductive bridge 21.

In some embodiments, the plurality of first through holes 211 are disposed separately along a length direction of the first conductive bridge 21, that is, a connection portion of the first conductive bridge 21 is reserved between adjacent first through holes 211 and the connection portion is located in a width direction of the first conductive bridge 21. Therefore, the problem of an excessive reduction in strength of the first conductive bridge 21 due to the presence of the first through holes 211 can be avoided to a certain extent.

It is to be noted that when the first conductive bridge 21 has a regular rectangular structure, a direction formed by long sides of the rectangular structure is a length direction. When the first conductive bridge 21 has an irregular structure, for example, the first conductive bridge is composed of a plurality of portions having a rectangular-like structure, the length direction of the first conductive bridge 21 may be construed as a length direction of the rectangular-like structure.

In some embodiments, structures of the plurality of first through holes 211 may be completely identical. In some embodiments, it is not excluded that the structure of at least one of the plurality of first through holes 211 is different from the structure of other second through holes.

In an embodiment, a hole wall of the first through hole 211 includes at least one of a curved surface or a plane, that is, a shape of the first through hole 211 may be determined according to actual needs, to ensure that an area of the first conductive bridge 21 can be reduced as much as possible while the first conductive bridge 21 has sufficient strength.

Optionally, the first through hole 211 may be a rectangular hole, a triangular hole, a round hole or an elliptical hole.

In some embodiments, the first through hole 211 includes an irregular hole whose hole wall is composed of a curved surface and a plane.

In some embodiments, the first through hole 211 may be a polygonal hole, and the number of walls of a hole wall of the first through hole 211 may be greater than 4.

In an embodiment, the plurality of conductive bridges further include a second conductive bridge 22 and a third conductive bridge 23. The first conductive bridge 21, the second conductive bridge 22 and the third conductive bridge 23 are disposed in sequence. A distance value between the first conductive bridge 21 and the second conductive bridge 22 is not equal to a distance value between the second conductive bridge 22 and the third conductive bridge 23.

In an embodiment, as illustrated in FIG. 1, the second conductive bridge 22 is provided with a second through hole 221, that is, an area of the conductive bridge may be further reduced by providing the second through hole 221, thereby reducing warpage of the body 10.

In an embodiment, there are a plurality of second through holes 221, and the plurality of second through holes 221 are separately disposed on the second conductive bridge 22, that is, adjacent second through holes 221 are not communicated with each other, so that structural strength of the second conductive bridge 22 can be ensured, and an area of the conductive bridge can be further reduced.

In some embodiments, the plurality of second through holes 221 may be disposed arbitrarily on the second conductive bridge 22.

In some embodiments, the plurality of second through holes 221 are disposed separately along a length direction of the second conductive bridge 22, that is, a connection portion of the second conductive bridge 22 is reserved between adjacent second through holes 221 and the connection portion is located in a width direction of the second conductive bridge 22. Therefore, the problem of an excessive reduction in strength of the second conductive bridge 22 due to the presence of the second through holes 221 can be avoided to a certain extent.

It is to be noted that when the second conductive bridge 22 has a regular rectangular structure, a direction formed by long sides of the rectangular structure is the length direction. When the second conductive bridge 22 has an irregular structure, for example, the second conductive bridge is composed of a plurality of portions having a rectangular-like structure, the length direction of the second conductive bridge 22 may be construed as a length direction of the rectangular-like structure.

In some embodiments, structures of the plurality of second through holes 221 may be completely identical. In some embodiments, it is not excluded that the structure of at least one of the plurality of second through holes 221 is different from the structure of other second through holes.

In an embodiment, a hole wall of the second through hole 221 includes at least one of a curved surface or a plane, that is, a shape of the second through hole 221 may be determined according to actual needs, to ensure that an area of the second conductive bridge 22 can be reduced as much as possible while the second conductive bridge 22 has sufficient strength.

Optionally, the second through hole 221 may be a rectangular hole, a triangular hole, a round hole or an elliptical hole.

In some embodiments, the second through hole 221 includes an irregular hole whose hole wall is composed of a curved surface and a plane.

In some embodiments, the second through hole 221 may be a polygonal hole, and the number of walls of a hole wall of the second through hole 221 may be greater than 4.

In an embodiment, shapes of the first through hole 211 and the second through hole 221 may be completely identical. In some embodiments, shapes of the first through hole 211 and the second through hole 221 may be different, which is not limited here.

In an embodiment, as illustrated in FIG. 1, the opening region 11 may be a rectangular region. In this case, the first conductive bridge 21, the second conductive bridge 22 and the third conductive bridge 23 may be disposed separately along a length direction of the opening region 11.

In an embodiment, as illustrated in FIG. 1, the third conductive bridge 23 is provided with a third through hole 231, that is, an area of the conductive bridge may be further reduced by providing the third through hole 231, thereby reducing warpage of the body 10.

In an embodiment, there are a plurality of third through holes 231, and the plurality of third through holes 231 are separately disposed on the third conductive bridge 23, that is, adjacent third through holes 231 are not communicated with each other, so that structural strength of the third conductive bridge 23 can be ensured, and an area of the conductive bridge can be further reduced.

In some embodiments, the plurality of third through holes 231 may be disposed arbitrarily on the third conductive bridge 23.

In some embodiments, the plurality of third through holes 231 are disposed separately along a length direction of the third conductive bridge 23, that is, a connection portion of the third conductive bridge 23 is reserved between adjacent third through holes 231 and the connection portion is located in a width direction of the third conductive bridge 23. Therefore, the problem of an excessive reduction in strength of the third conductive bridge 23 due to the presence of the third through holes 231 can be avoided to a certain extent.

It is to be noted that when the third conductive bridge 23 has a regular rectangular structure, a direction formed by long sides of the rectangular structure is the length direction. When the third conductive bridge 23 has an irregular structure, for example, the third conductive bridge is composed of a plurality of portions having a rectangular-like structure, the length direction of the third conductive bridge 23 may be construed as a length direction of the rectangular-like structure.

In some embodiments, structures of the plurality of third through holes 231 may be completely identical. In some embodiments, it is not excluded that the structure of at least one of the plurality of third through holes 231 is different from the structure of other third through holes.

In an embodiment, a hole wall of the third through hole 231 includes at least one of a curved surface or a plane, that is, a shape of the third through hole 231 may be determined according to actual needs, to ensure that an area of the third conductive bridge 23 can be reduced as much as possible while the third conductive bridge 23 has sufficient strength.

Optionally, the third through hole 231 may be a rectangular hole, a triangular hole, a round hole or an elliptical hole.

In some embodiments, the third through hole 231 includes an irregular hole whose hole wall is composed of a curved surface and a plane.

In some embodiments, the third through hole 231 may be a polygonal hole, and the number of walls of a hole wall of the third through hole 231 may be greater than 4.

In some embodiments, a structural form of the third conductive bridge 23 may be similar to that of one of the first conductive bridge 21 or the second conductive bridge 22.

In an embodiment, shapes of the first through hole 211, the second through hole 221 and the third through hole 231 may be completely identical. In some embodiments, shapes of at least two of the first through hole 211, the second through hole 221 and the third through hole 231 may be different, which is not limited here.

In an embodiment, the conductive bridges may further include a fourth conductive bridge, and the fourth conductive bridge may also be provided with a fourth through hole similar to the first through hole 211, the second through hole 221 or the third through hole 231 described above.

Optionally, a structural form of the fourth conductive bridge may be completely different from structural forms of the first conductive bridge 21, the second conductive bridge 22 and the third conductive bridge 23. Alternatively, a structural form of the fourth conductive bridge may be identical to structural forms of at least one of the first conductive bridge 21, the second conductive bridge 22 or the third conductive bridge 23, which is not limited here.

In some embodiments, any one of the first conductive bridge 21, the second conductive bridge 22, the third conductive bridge 23 and the fourth conductive bridge may be a plurality of conductive bridges.

In an embodiment, as illustrated in FIG. 2 to FIG. 5, the first conductive bridge 21 has a rectangular structure.

Figure 2:
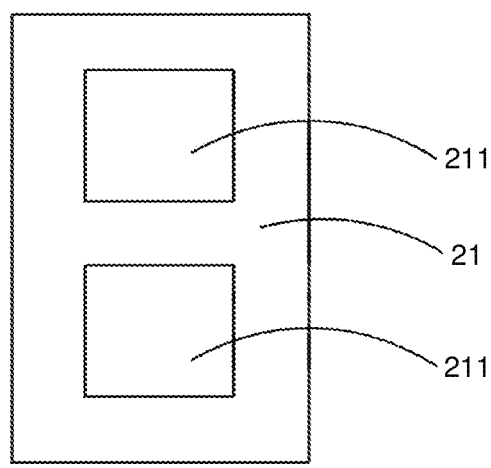
FIG. 2 is a schematic structure diagram of a first embodiment of a first conductive bridge in a package substrate according to an exemplary implementation.

Optionally, as illustrated in FIG. 2, the first conductive bridge 21 has a rectangular structure. There are at least two first through holes 211 in the rectangular structure. The first through holes 211 are all squares.

Figure 3:
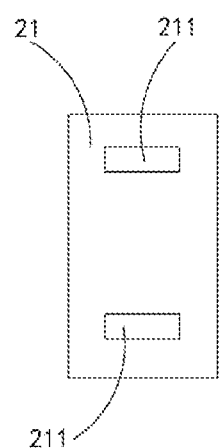
FIG. 3 is a schematic structure diagram of a second embodiment of a first conductive bridge in a package substrate according to an exemplary implementation.

Optionally, as illustrated in FIG. 3, the first conductive bridge 21 has a rectangular structure. There are at least two first through holes 211 in the rectangular structure. The first through holes 211 are all rectangles.

Figure 4:
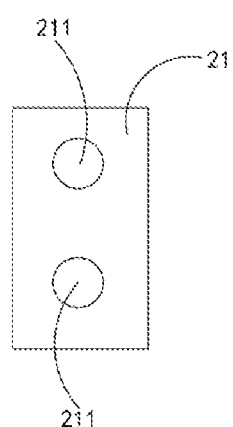
FIG. 4 is a schematic structure diagram of a third embodiment of a first conductive bridge in a package substrate according to an example implementation.

Optionally, as illustrated in FIG. 4, the first conductive bridge 21 has a rectangular structure. There are at least two first through holes 211 in the rectangular structure. The first through holes 211 are all rounds.

Figure 5:
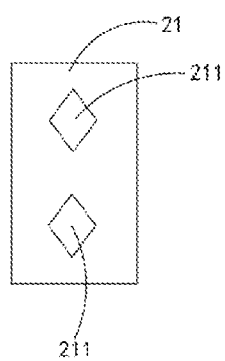
FIG. 5 is a schematic structure diagram of a fourth embodiment of a first conductive bridge in a package substrate according to an exemplary implementation.

Optionally, as illustrated in FIG. 5, the first conductive bridge 21 has a rectangular structure. There are at least two first through holes 211 in the rectangular structure. The first through holes 211 are all diamonds.

It is to be noted that, one of the second conductive bridge 22, the third conductive bridge 23 and the fourth conductive bridge may be any one of the structural forms shown in FIG. 2 to FIG. 5.

In an embodiment, the first conductive bridge 21 includes: a first bridging section 212, a second bridging section 213 and a third bridging section 214. Both ends of the first bridging section 212 are connected with the body 10. Both ends of the second bridging section 213 are connected with the body 10. The first bridging section 212 and the second bridging section 213 are disposed separately. Both ends of the third bridging section 214 are respectively connected with the first bridging section 212 and the second bridging section 213. At least one of the first bridging section 212, the second bridging section 213 or the third bridging section 214 is provided with a first through hole 211.

Figure 6:
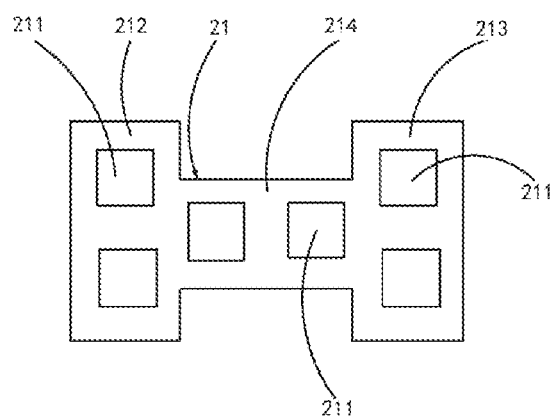
FIG. 6 is a schematic structure diagram of a fifth embodiment of a first conductive bridge in a package substrate according to an exemplary implementation.

Specifically, with reference to FIG. 6, the first conductive bridge 21 includes a first bridging section 212, a second bridging section 213 and a third bridging section 214. The first bridging section 212 and the second bridging section 213 provide connections to the body 10. The third bridging section 214 provides a connection between the first bridging section 212 and the second bridging section 213. The first conductive bridge 21 with this structural form has high strength. In addition, due to arrangement of first through holes 211, an area of the first conductive bridge 21 may not increase, thereby reducing warpage of the body 10.

The first bridging section 212, the second bridging section 213 and the third bridging section 214 are all rectangular-like structures and form an H-shaped structure. Each of the first bridging section 212, the second bridging section 213 and the third bridging section 214 is provided with at least one first through hole 211.

In some embodiments, the first bridging section 212, the second bridging section 213 and the third bridging section 214 may be of an integrally formed structure.

In some embodiments, the first bridging section 212, the second bridging section 213 and the third bridging section 214 may be formed by connecting several independent structures.

It is to be noted that any one of the second conductive bridge 22, the third conductive bridge 23 and the fourth conductive bridge may be the structural form illustrated in FIG. 6.

In an embodiment, the first conductive bridge 21 includes: a first bridging section 212, a second bridging section 213 and a third bridging section 214. One end of the first bridging section 212 is connected with the body 10. One end of the second bridging section 213 is connected with the body 10. One end of the third bridging section 214 is connected with the other end of the first bridging section 212 and the other end of the second bridging section 213, and the other end of the third bridging section 214 is connected with the body 10. At least one of the first bridging section 212, the second bridging section 213 or the third bridging section 214 is provided with a first through hole 211.

Figure 7:
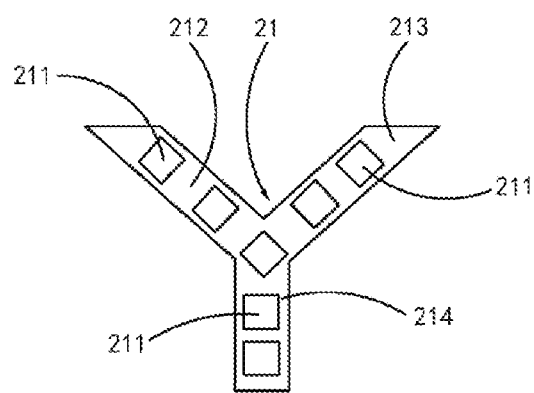
FIG. 7 is a schematic structure diagram of a sixth embodiment of a first conductive bridge in a package substrate according to an exemplary implementation.

Specifically, with reference to FIG. 7, the first conductive bridge 21 includes a first bridging section 212, a second bridging section 213 and a third bridging section 214. One end of the first bridging section 212, one end of the second bridge section 213 and one end of the third bridging section 214 are connected to a same point, and the other ends of three bridging sections are connected with the body 10 respectively. The first conductive bridge 21 with this structural form has high strength. In addition, due to arrangement of first through holes 211, an area of the first conductive bridge 21 may not increase, thereby reducing warpage of the body 10.

The first bridging section 212, the second bridging section 213 and the third bridging section 214 are all rectangular-like structures and form a Y-shaped structure. Each of the first bridging section 212, the second bridging section 213 and the third bridging section 214 is provided with at least one first through hole 211.

In some embodiments, the first bridging section 212, the second bridging section 213 and the third bridging section 214 may be formed by connecting several independent structures.

It is to be noted that, any one of the second conductive bridge 22, the third conductive bridge 23 and the fourth conductive bridge may be the structural form illustrated in FIG. 7.

It is to be noted that a specific structural design of an upper surface of the body 10 may refer to structural forms in the related art. Of course, it is not excluded that the specific structural design of the upper surface is similar to a specific structural design of a lower surface in this embodiment.

In the package substrate of the present disclosure, the opening region is formed on the body, and the plurality of conductive bridges are disposed separately in the opening region, so that signal transmission quality of the conductive bridges can be enhanced. Moreover, the plurality of distance values between the plurality of conductive bridges are not all equal, that is, some conductive bridges distributed in the opening region are relatively dense. Therefore, packaging resin can be blocked during packaging the package substrate, such that a flow rate of the packaging resin can be reduced and gas in the opening region can be exhausted in time. Therefore, a problem of internal hollows can be avoided, and the performance of the package substrate can be improved.

An embodiment of the present disclosure provides a semiconductor structure, including the above-described package substrate and a chip.

In the semiconductor structure according to an embodiment of the present disclosure, an opening region 11 is formed on a body 10 of the package substrate, and a plurality of conductive bridges that are disposed separately in the opening region 11, so that signal transmission quality of the conductive bridges can be enhanced. Moreover, the plurality of distance values between the plurality of conductive bridges are not all equal, that is, some conductive bridges distributed in the opening region 11 are relatively dense. Therefore, packaging resin can be blocked during packaging the package substrate, such that a flow rate of the packaging resin can be reduced and gas in the opening region 11 can be exhausted in time. Therefore, the problem of internal hollows can be avoided, and the performance of the package substrate can be improved.

In an embodiment, one or more chips may be connected with the body 10.

Other implementation solutions of the present disclosure will be apparent to those skilled in the art when considering the specification and practicing the disclosure disclosed herein. The present disclosure is intended to cover any variations, uses, or adaptations of the present disclosure following the general principles thereof and including such departures from the embodiments of the disclosure as come within known or customary practice in the art. The specification and exemplary implementations are considered as exemplary only, with a true scope and spirit of the embodiments of the disclosure being indicated by the claims.

It is to be understood that the present disclosure is not limited to the accurate constructions that are described in the foregoing and illustrated in the drawings, and that modifications and changes may be made without departing from the scope of the present disclosure. The scope of the present disclosure is limited only by the appended claims.

The invention claimed is:

1. A package substrate, comprising:
   a body including an opening region; and
   a plurality of conductive bridges disposed separately in the opening region, and adjacent conductive bridges among the plurality of conductive bridges having a respective distance value, and there are a plurality of distance values among of the plurality of conductive bridges; and,
   wherein at least two distance values among the plurality of distance values are not equal; and
   the plurality of conductive bridges comprise: a first conductive bridge provided with a first through hole.

2. The package substrate of claim 1, wherein a gap is provided between the adjacent conductive bridges, and the body is provided with a vent hole which is opposite to the gap.

3. The package substrate of claim 2, wherein there are a plurality of vent holes, the plurality of vent holes are separately disposed on the body, and each of the plurality of vent holes corresponds to a respective gap.

4. The package substrate of claim 3, wherein there are a plurality of hole pitches between the plurality of vent holes, a hole pitch is a pitch between adjacent vent holes, and at least two hole pitches in the plurality of hole pitches are not equal.

5. The package substrate of claim 4, wherein the plurality of hole pitches are all different from each other, and the plurality of hole pitches gradually increase along a first length direction of the opening region.

6. The package substrate of claim 4, wherein adjacent conductive bridges between adjacent vent holes with a largest hole pitch have a largest distance value.

7. The package substrate of claim 3, wherein there are at least two conductive bridges between adjacent vent holes.

8. The package substrate of claim 7, wherein there are at least three conductive bridges between the adjacent vent holes, and distance values between adjacent conductive bridges in the at least three conductive bridges are all equal.

9. The package substrate of claim 3, wherein the plurality of vent holes comprises a first vent hole, a second vent hole and a third vent hole, the first vent hole, the second vent hole and the third vent hole are disposed in sequence, there are a plurality of conductive bridges between the first vent hole and the second vent hole, and there are a plurality of conductive bridges between the second vent hole and the third vent hole; and
   wherein a distance value between adjacent conductive bridges between the first vent hole and the second vent hole is not equal to a distance value between adjacent conductive bridges between the second vent hole and the third vent hole.

10. The package substrate of claim 1, wherein the body further comprises a solder ball region located outside the opening region, the package substrate further comprises a conductive layer located within the solder ball region; and
    a surface of the body comprises a first region and a second region which are distributed in sequence along a length direction of the opening region, the first region and the second region both comprise conductive bridges and the conductive layer, a ratio of a sum of an area of the conductive bridges and an area the conductive layer in the first region to a sum of an area of the conductive bridges and an area of the conductive layer in the second region is less than 1.1, or a ratio of a sum of an area of the conductive bridges and an area the conductive layer in the second region to a sum of an area of the conductive bridges and an area of the conductive layer in the first region is less than 1.1.

11. The package substrate of claim 10, wherein an area of the conductive bridges in the first region is greater than an area of the conductive bridges in the second region, and an area of the conductive layer in the first region is less than an area of the conductive layer in the second region.

12. The package substrate of claim 1, wherein the plurality of conductive bridges further comprise:
    a second conductive bridge; and
    a third conductive bridge,
    wherein the first conductive bridge, the second conductive bridge and the third conductive bridge are disposed in sequence, and a distance value between the first conductive bridge and the second conductive bridge is not equal to a distance value between the second conductive bridge and the third conductive bridge.

13. The package substrate of claim 12, wherein the second conductive bridge is provided with a second through hole, and the third conductive bridge is provided with a third through hole.

14. The package substrate of claim 13, wherein there are a plurality of first through holes; or, there are a plurality of second through holes; or, there are a plurality of third through holes.

15. The package substrate of claim 13, wherein the first conductive bridge comprises:
    a first bridging section, both ends of the first bridging section being connected to the body;
    a second bridging section, both ends of the second bridging section being connected to the body, and the first bridging section and the second bridging section being disposed separately; and
    a third bridging section, two ends of the third bridging section being connected with the first bridging section and the second bridging section, respectively;
    wherein at least one of the first bridging section, the second bridging section or the third bridging section is provided with the first through hole.

16. The package substrate of claim 1, wherein the first conductive bridge comprises:
    a first bridging section, one end of the first bridging section being connected to the body;
    a second bridging section, one end of the second bridging section being connected to the body;
    a third bridging section, one end of the third bridging section being connected with the other end of the first bridging section and the other end of the second bridging section, and the other end of the third bridging section being connected to the body;
    wherein at least one of the first bridging section, the second bridging section or the third bridging section is provided with the first through hole.

17. A semiconductor structure, comprising a chip and the package substrate of claim 1.

18. A package substrate, comprising:
    a body including an opening region; and
    a plurality of conductive bridges comprising a first conductive bridge, a second conductive bridge and a third conductive bridge, the first conductive bridge, the second conductive bridge and the third conductive bridge being disposed in sequence in the opening region; and, wherein a distance value between the first conductive bridge and the second conductive bridge is not equal to a distance value between the second conductive bridge and the third conductive bridge; and the first conductive bridge provided with a first through hole.

19. A package substrate, comprising:

a body including an opening region, the opening region comprising a first side wall and a second side wall opposite to each other, and a packaging glue entering the opening region from the first side wall and flowing to the second side wall; and a plurality of conductive bridges disposed separately in the opening region;

wherein conductive bridges, among the plurality of conductive bridges, close to the first side wall are arranged more densely than conductive bridges, among the plurality of conductive bridges, close to the second side wall; and, wherein the plurality of conductive bridges comprise: a first conductive bridge provided with a first through hole.

* * * * *